(12) United States Patent
Guilford et al.

(10) Patent No.: US 9,733,858 B2
(45) Date of Patent: Aug. 15, 2017

(54) SUPPORTING DATA COMPRESSION USING MATCH SCORING

(71) Applicant: Intel Corporation, Santa Clara, CA (US)

(72) Inventors: James D. Guilford, Northborough, MA (US); Vinodh Gopal, Westborough, MA (US); Gilbert M. Wolrich, Framingham, MA (US); Daniel F. Cutter, Maynard, MA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/427,866

(22) Filed: Feb. 8, 2017

(65) Prior Publication Data

US 2017/0147255 A1    May 25, 2017

Related U.S. Application Data

(63) Continuation of application No. 15/229,478, filed on Aug. 5, 2016, now Pat. No. 9,594,695, which is a
(Continued)

(51) Int. Cl.
*H03M 7/34* (2006.01)
*G06F 3/06* (2006.01)
*H03M 7/40* (2006.01)

(52) U.S. Cl.
CPC .......... *G06F 3/0638* (2013.01); *G06F 3/0608* (2013.01); *G06F 3/0673* (2013.01); *H03M 7/40* (2013.01)

(58) Field of Classification Search
CPC ...... H03M 7/40; G06F 3/0673; G06F 3/0638; G06F 3/0653; G03F 3/0604
(Continued)

(56) References Cited

U.S. PATENT DOCUMENTS 5,532,694 A    7/1996 Mayers
7,538,695 B2   5/2009 Laker
(Continued)

OTHER PUBLICATIONS

P.Deutsch, "DEFLATE Compressed Data Formal Specification version (RFC1951)", Aladdin Enterprises May 1996 (15 pages) http://wwwJaqs.org/rfcs/rfc1951.html.
(Continued)

*Primary Examiner* — Khai M Nguyen
(74) *Attorney, Agent, or Firm* — Lowenstein Sandler LLP

(57) ABSTRACT

A processing system is provided that includes a memory for storing an input bit stream and a processing logic, operatively coupled to the memory, to generate a first score based on: a first set of matching data related to a match between a first bit subsequence and a candidate bit subsequence within the input bit stream, and a first distance of the candidate bit subsequence from the first set of matching data. A second score is generated based on a second set of matching data related to a match between a second bit subsequence and the candidate bit subsequence, and a second distance of the candidate bit subsequence from the second set of matching data. A code to replace the first or second bit subsequence in an output bit stream is identified. Selection of the one of the bit subsequences to replace is based on a comparison of the scores.

20 Claims, 12 Drawing Sheets

Related U.S. Application Data continuation of application No. 14/858,752, filed on Sep. 18, 2015, now Pat. No. 9,419,648.

(58) Field of Classification Search
USPC .............................................. 341/51, 65, 67
See application file for complete search history.

(56) References Cited

U.S. PATENT DOCUMENTS

| 8,766,827 B1 * | 7/2014 | Milne ................. | H03M 7/3084 |
| | | | 341/51 |
| 9,264,068 B2 | 2/2016 | Wu | |
| 9,584,155 B1 * | 2/2017 | Gopal ................. | H03M 7/3086 |
| | | | 341/51 |

OTHER PUBLICATIONS

David A. Huffman, "A Method for the Construction of Minimum-Redundancy Codes", Proceedings of the I.R.E., Sep. 1952, vol. 40, No. 9, pp. 1098-1101 (4 pages).
Jacob Ziv et al., "A Universal Algorithm for Sequential Data Compression", IEEE Transactions on Information Theory, vol. IT-23, No. 3, May 1977, pp. 337-343 (7 pages).
USPTO, Notice of Allowance for U.S. Appl. No. 14/858,752, dated Apr. 25, 2016, 11 pages.

* cited by examiner

SUPPORTING DATA COMPRESSION USING MATCH SCORING

RELATED APPLICATIONS

This application is a continuation of U.S. patent application Ser. No. 15/229,478, filed Aug. 5, 2016, which is a continuation of U.S. patent application Ser. No. 14/858,752, filed Sep. 18, 2015, the entirety of which are incorporated herein by reference.

TECHNICAL FIELD

Embodiments of the disclosure relate generally to computer systems, and more specifically, but without limitation, to supporting data compression using match scoring.

BACKGROUND

In contemporary computer systems and networking, data compression algorithms, such as deflate compression, is often used to perform on-the-fly data compression at a transmission point of the data and decompression at a receiving end. Many compression algorithms using deflate compressed data provide lossless data compression using a combination of the Lempel-Ziv (LZ) algorithm and Huffman coding. More particularly, deflate uses LZ to reduce the number of symbols in a give block of data and subsequently uses Huffman coding to reduce the number of bits consumed by individual symbols. Deflate compression is used in various compressed formats, including GZIP and PKZIP.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
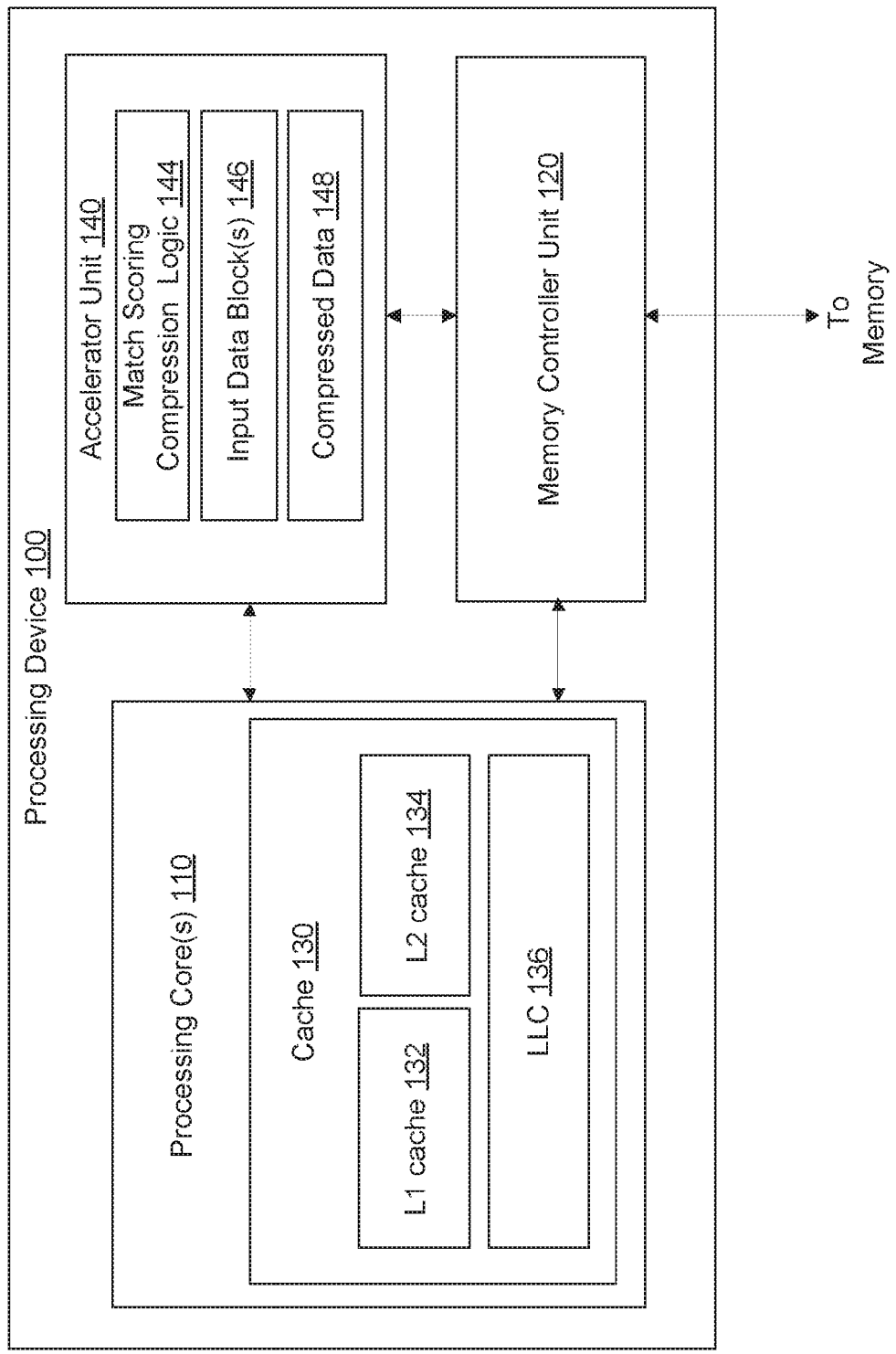
FIG. 1 illustrates a block diagram of a processing device for supporting data compression using match scoring according to one embodiment.

Embodiments of the disclosure implement techniques for supporting data compression using match scoring. The techniques described herein may be used to improve a data compression ratio achieved in certain compression techniques, such as deflate compression techniques. The data compression ratio may be defined as a ratio between an uncompressed size and compressed size of data. A standard format of data used in the compression techniques may include a series of data blocks, which correspond to an input data stream of successive data bits of a particular length.

In one embodiment, certain deflate compression techniques may perform compression by matching a bit sequence (or "byte" sequence with a byte corresponding to a number of bits) found in the input data stream with another bit sequence that has been found earlier in the input data stream. When matching sequences of the bit sequence are found in the input data stream, the input data stream is compressed by appending a code representing the bit sequence to an output stream. For example, the code may be a Huffman code representing "literals" that represents a copy of the bit sequence and/or a length-distance (L, BD) pair of symbols that describe the copy. The length-distance pair indicates a backward distance (BD) to go back from the current input data location, to locate repeat or match of a given length (L) of the data sequence. The references may be used to replace data occurring in the same or a previous data block, for example, up to 32K of input data bytes back.

In some compression algorithms, once raw input data has been turned into a string of literals and special length, distance pairs, these elements may be represented with certain codes, such as Huffman codes. In some situations, a Huffman code may define a data element (e.g., a variable length of bytes) for reconstruction of the original input data prior to compression. For example, each Huffman code may represent either literal bytes ranging from 0 to 255, the length in bytes of a repeated data pattern from the (L, BD) pair of symbols and the backward distance, in bytes, of a repeated data pattern, measured with respect to the code's position. The code may be followed by a number of "extra bits" for understanding a context of the data element that preceded them. For example, a data element for a backward distance (BD) code representing a range of 1024-2047 bytes may be followed by a 10-bit extra-bits field, where the 10-bits are interpreted as a binary integer between 0 and 1023. The binary integer may then be added to the beginning point of the range, e.g., 1024, to yield an exact distance. Thus, the data elements and the extra bits may be used to reconstruct the input data being represented by the Huffman code (e.g., the literal, length or backward distance).

To identify matches, the input data stream is searched to identify multiple occurrences of the bit sequence. The compression techniques may keep track of the location of the bit sequences in the input data stream using a data structure to index the locations. The data structure in which location data of the matches are held may be referred to as a history window. During the compression process, a number of locations in the input data stream are searched to determine the "best" match to the bit sequence. Traditionally, the "best" match is chosen as the one with the longest match to the bit sequence. When there are two or more matches of the same longest length, the best match is taken as the closer one, e.g., the one with the shortest distance. For instant, when comparing two matches, the "best" match is the one with the longest length, or if the lengths are the same, the one with the shorter distance. The "best" match is then encoded. For example, to encode the match, the original data may be replaced with a combination of literals and length-distance (L, BD) reference symbols, and then encoded into a binary representation (e.g., using Huffman codes).

Embodiments of the present disclosure provide improvements on the compression ratio in deflate compression techniques by generating a matching score for each identified match of the bit sequence. The matching score may be used to determine a "best" match rather than using a longest match to the bit sequence. The score of a data sequence is a heuristic that indicates the quality of a match by indicating a relative measure of which sequence will generate fewer output bits if that data sequence is used to compress the input data stream. For example, a slightly shorter match (e.g., one byte shorter) that is relatively closer distance is often a better match that a slightly longer match further away. In some embodiments, this is because more "extra bits" are generated in the output stream for matches that are a farther distance away. Thus, by using the relatively closer bit sequence with a slightly shorter match, the input data stream may be compressed more efficiently.

In one embodiment, the techniques disclosed herein may be embedded in a combination of hardware circuitry and software of an encoder/decoder device implementing a deflate compression technique. In an alternative embodiment, the techniques disclosed herein may be incorporated into a dedicated hardware device (e.g., an accelerator) coupled to a processor of a processing system. In some embodiments, the hardware device may be within the processor, such as in an execution unit, or it may on a separate device from the processor. In one embodiment, the hardware device may include some logic or instructions that are outside of processor cores of the processor. The instructions may allow the hardware device to accelerate a particular job rather than executing the job in the processor cores. For example, the processor cores may submit a job, such as a network job, to the hardware device, which in turn may perform compression on some data associated with the network job. The processor cores can then operate independently on other jobs. When the hardware device is finished with the compression, a signal may be sent to the processor cores that compressed results data is ready for output. Thus, the processor may use the hardware device to off-load an amount of work from the processor cores to improve performance of the processing system.

FIG. 1 illustrates a block diagram of a processing device 100 for supporting data compression using match scoring according to one embodiment. The processing device 100 may be generally referred to as "processor" or "CPU". "Processor" or "CPU" herein shall refer to a device capable of executing instructions encoding arithmetic, logical, or I/O operations. In one illustrative example, a processor may include an arithmetic logic unit (ALU), a control unit, and a plurality of registers. In a further aspect, a processor may include one or more processing cores, and hence may be a single core processor which is typically capable of processing a single instruction pipeline, or a multi-core processor which may simultaneously process multiple instruction pipelines. In another aspect, a processor may be implemented as a single integrated circuit, two or more integrated circuits, or may be a component of a multi-chip module (e.g., in which individual microprocessor dies are included in a single integrated circuit package and hence share a single socket).

As shown in FIG. 1, processing device 100 may include various components. In one embodiment, processing device 100 may include one or more processors cores 110 and a memory controller unit 120, among other components, coupled to each other as shown. The processing device 100 may also include a communication component (not shown) that may be used for point-to-point communication between various components of the processing device 100. The processing device 100 may be used in a computing system (not shown) that includes, but is not limited to, a desktop computer, a tablet computer, a laptop computer, a netbook, a notebook computer, a personal digital assistant (PDA), a server, a workstation, a cellular telephone, a mobile computing device, a smart phone, an Internet appliance or any other type of computing device. In another embodiment, the processing device 100 may be used in a system on a chip (SoC) system. In one embodiment, the SoC may comprise processing device 100 and a memory. The memory for one such system is a DRAM memory. The DRAM memory can be located on the same chip as the processor and other system components. Additionally, other logic blocks such as a memory controller or graphics controller can also be located on the chip.

The processor core(s) 110 may execute instructions of the processing device 100. The instructions may include, but are not limited to, pre-fetch logic to fetch instructions, decode logic to decode the instructions, execution logic to execute instructions and the like. The computing system may be representative of processing systems based on the Pentium® family of processors and/or microprocessors available from Intel® Corporation of Santa Clara, Calif., although other systems (including computing devices having other microprocessors, engineering workstations, set-top boxes and the like) may also be used. In one embodiment, a sample computing system may execute a version of an operating system, embedded software, and/or graphical user interfaces. Thus, embodiments of the disclosure are not limited to any specific combination of hardware circuitry and software.

In an illustrative example, processing core 110 may have a micro-architecture including processor logic and circuits. Processor cores with different micro-architectures can share at least a portion of a common instruction set. For example, similar register architectures may be implemented in different ways in different micro-architectures using various techniques, including dedicated physical registers, one or more dynamically allocated physical registers using a register renaming mechanism (e.g., the use of a register alias table (RAT), a reorder buffer (ROB) and a retirement register file).

Memory controller 120 may perform functions that enable the processing device 100 to access and communicate with memory (not shown) that includes a volatile memory and/or a non-volatile memory. In some embodiments, the memory controller 120 may be located on a processor die associated with processing device 100, while the memory is located off the processor die. In some embodiments, the processing device 100 includes a cache unit 140 to cache instructions and/or data. The cache unit 130 includes, but is not limited to, a level one (L1) 132, level two (L2) 134, and a last level cache (LLC) 136, or any other configuration of the cache memory within the processing device 100. In some embodiments, the L1 cache 132 and L2 cache 134 can transfer data to and from the LLC 136. In one embodiment, the memory controller 120 can be connected to the LLC 136 to transfer data between the cache unit 130 and memory. As shown, the cache unit 130 can be integrated into the processing cores 110. The cache unit 130 may store data (e.g., including instructions) that are utilized by one or more components of the processing device 100.

In some embodiments, the processing device 100 may implement compression techniques, such as deflate compression, for supporting data compression of data from the cache unit 130. In one embodiment, the deflate compression may be performed by dedicated hardware, such as accelerator unit 140, coupled to the processing device 100. In some embodiments, the accelerator unit 140 may operate asynchronously with respect to the processing cores 110. In one embodiment, the accelerator unit 140 may reside on the same die as the processing cores 110. In other embodiments, the accelerator unit 140 may disposed on a separate device that can be added to a system associated with the processing device, such as a Peripheral Component Interconnect (PCI) add-in card. Alternatively, the accelerator unit 140 may be coupled to other system components. In some embodiments, the functionality of the accelerator unit 140 can exist in a fewer or greater number of modules than what is shown.

In one embodiment, the accelerator unit 140 may include a micro-architecture including processor logic and circuits similar to the processing cores 110. In some embodiment, accelerator unit 140 may include a dedicated portion of the same processor logic and circuits used by the processing cores 110. The accelerator unit 140 may be capable of executing compression operations in accordance with match scoring compression logic 144 encoded therein. The compression operations of the match scoring compression logic 144 may be executed by accelerator unit 140 in response to an instruction, such as an instruction from the processing device 100. For example, the accelerator unit 140 may receive an instruction to perform compression on a stream of input data blocks 146 based on the match scoring compression logic 144. The match scoring compression logic 144 may determine scores for repeated data sequences in the input data blocks 146 to indicate an amount of data saved in the data block when a given data sequence is used to compress the data block. As discussed above, the given repeated data the accelerator unit 140 to generate compressed data 148 from the input data blocks 146 may use sequence with the best score. Thereafter, the accelerator unit 140 may generate a signal when the compressed data 148 is complete.

Figure 2:
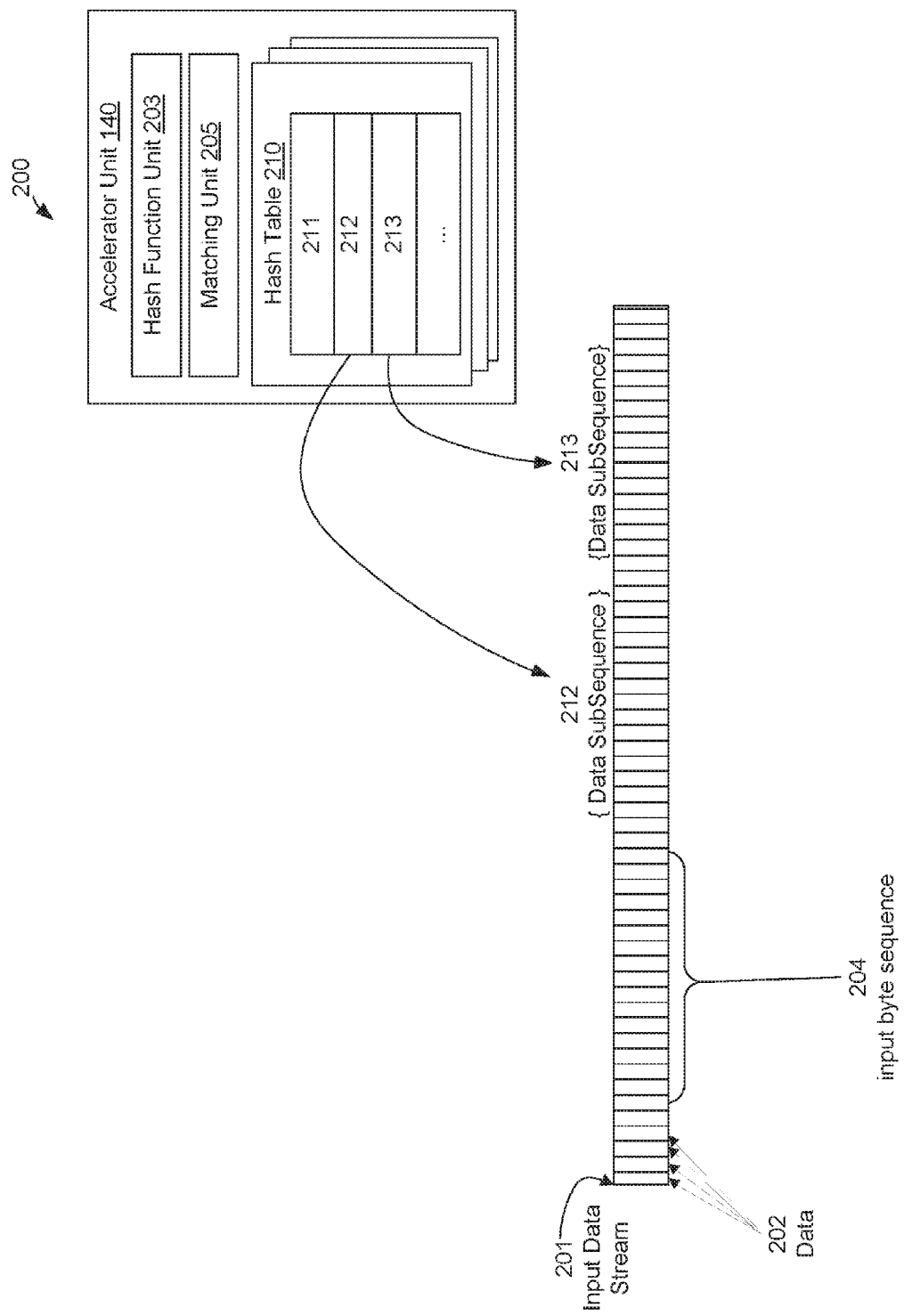
FIG. 2 illustrates a block diagram of a compression module for supporting data compression using match scoring according to one embodiment.

In FIG. 2, a block diagram of a compression module 200 for supporting data compression using match scoring according to one embodiment is shown. In this example, the compression module 200 may include accelerator unit 140 for executing compression operations. The compression module 200 may receive an input data stream 201 to be compressed. The input data stream 201 may include a plurality of data 202 (e.g., data bits, bytes, characters, etc.) that makes up a data block, such as one of the input data blocks 146 of FIG. 1.

The compression module 200 may perform searches to identify an input bit sequence 204. The input bit sequence 204 may include an initial sequence of data in the input data stream 201 where there are no repeated patterns of data in that initial sequence. In some embodiments, the compression module 200 may perform sequential or parallel searches or scans of the input data stream 201. As used herein, the term "parallel" can refer to dividing a series of processes to be executed sequentially into multiple subsets of processes. Each subset of processes can be executed concurrently with each other subset of processes. Executing the subsets of processes concurrently can reduce the amount of processing time associated with executing the entire series of processes as compared to executing the entire series of processes sequentially.

In some embodiments, hash function unit 203 may be used to identify multiple locations for searching for a match or duplicate of the input bit sequence 204 in the input data stream 201. In one embodiment, the hash function unit 203 may hash a candidate data subsequence of the input data stream 201 identified by the compression module 200. In one embodiment, the hash function unit 203 is configured to hash a plurality of data of an input data stream 201 to provide a hash pointer (e.g., an address, index or location) in a hash table 210. The hash table 210 may be a data structure (e.g., an array, tree, list or other types of data structures) that stores a number of entries. Each entry may contain a pointer pointing to a location in the input data stream 201. For example, pointers 211, 212 and 213 in hash table 210 may respectively point to candidate data subsequences 211, 212 and 213 in the input data stream 201. In some embodiments, if the number of pointers stored in the hash table 210 exceeds a threshold capacity of the hash table 210, some of the entries in the hash table 210 may be moved or spilled over to memory. For example, entries moved out of the hash table 210, can be the ones that are least frequently used or least recently used.

The data subsequences 211, 212 and 213, stored in the hash table 210 can be independently compared with the input bit sequence 204. In one embodiment, a matching unit 210 may use the pointers in the hash table 201 to search those locations in the input data steam 201 associated with the pointers to determine whether any portion of the data subsequences matches the input bit sequence 204. The matching unit 210 may also determine a length of the match of each data sequence locations to the input bit sequence 204. Typically, the matching unit 205 may select one of the data subsequences that have the longest match to the input bit sequence 204 as the "best" match. However, to improve the compression ratio of the compressed data, the compression module 200 may determine a score for each match based on a scoring algorithm that takes into account the distance between the matching subsequences to the input bit sequence 204. The data subsequence with a greater score may be identified as the "best" match rather than a data subsequence that may merely have a longest match to the input bit sequence 204. This scoring functionally is further discussed below with respect to FIG. 3.

Figure 3:
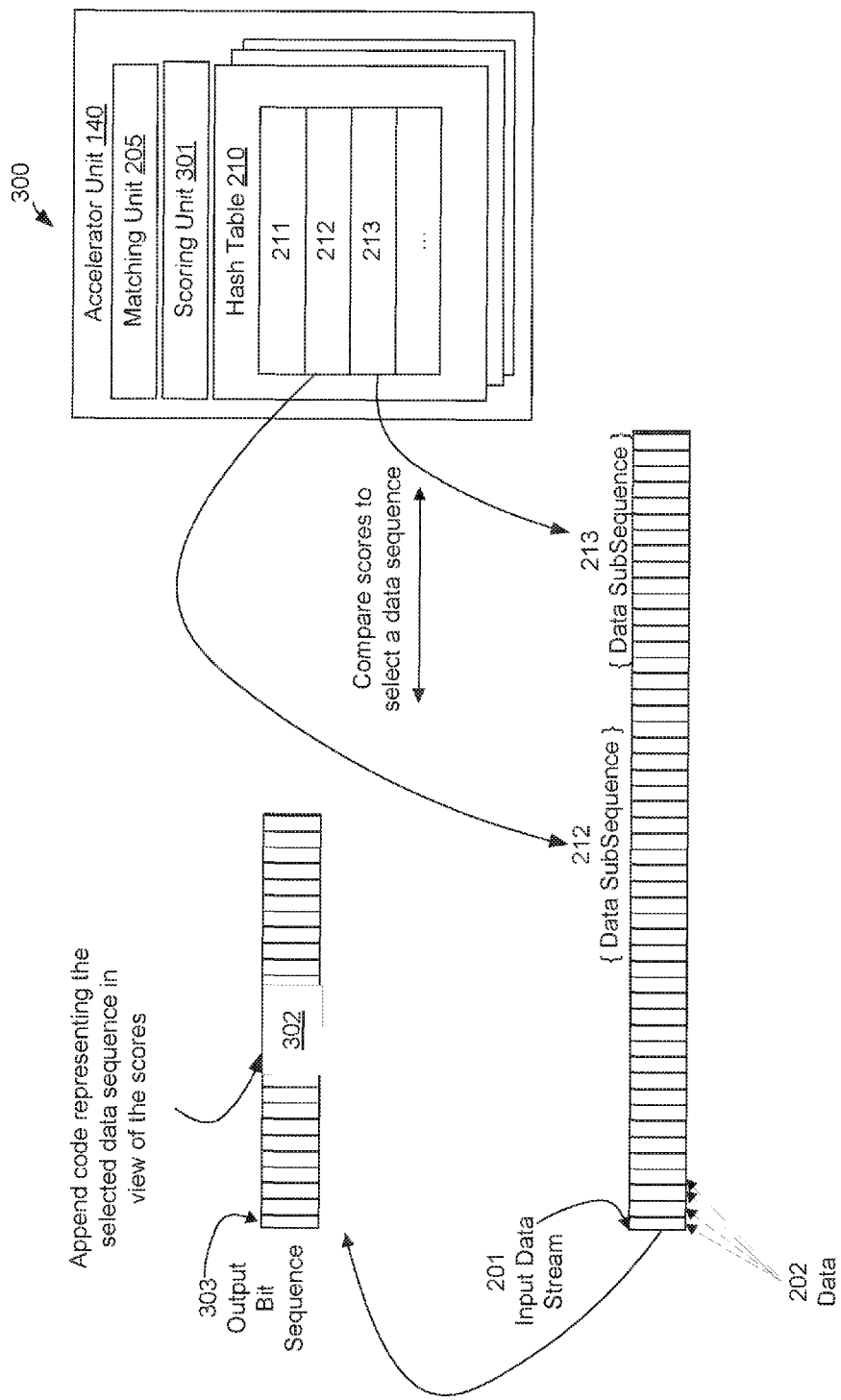
FIG. 3 illustrates a block diagram of a compression module for supporting data compression using match scoring according to another embodiment.

In FIG. 3, a block diagram of a compression module 300 for supporting data compression using match scoring according to another embodiment is shown. In this example, the compression module 200 may include accelerator unit 140 for executing compression operations, matching unit 205 to search for matches to the input bit sequence 204 in input data stream 201. In some embodiments, compression module 300 may also include a scoring unit 301. The compression module 300 may takes the results of the matches from the matching unit 205 and use the scoring unit 301 to decide which one is a "best" match to the input bit sequence 204. In one embodiment, the score for each match may be based on a scoring algorithm that may be used to indicate the quality of the match.

In one example, the scoring algorithm may be represented by the following equation:

Score (len, dist)=len*constant value−extra bits (dist)

In this example, "len" may represent a length of matching data between the input bit sequence 204 and a candidate data subsequence being scored, "dist" may represent a distance the input data stream 201 from this match to the input bit sequence 204, "constant value" may represent the average number of output bits used to represent an input byte and "extra bits" indicates how many "extra bits" to apply for a particular encoded (e.g., binary code representation) distance of matching data. The "extra bits" should be interpreted as a machine integer stored with the most-significant bit first, e.g., bits 1110 represent the value 14.

In one illustrative example, the extra bits calculation may be represented by the following equation:

extra bits (dist)=if (dist<5) then 0 else (BSR(dist−1)−1)

In this example, "BSR" represents a bit scan reverse processor instruction that when executed instructs the processor to locate the most significant logical one bit in a source data set and provides an output operand containing its position within the source data set.

In the scoring algorithm, the constant value may be set to a value, such as 8, which is a weigh for the length used in the score calculation. Typically, the greater the length of a match of a data subsequence to the input bit sequence 204 results in a greater number of data bits consumed from the input data stream 201 while minimizing the number of output bits generated. If a subsequence has a shorter length, it will "consume" fewer input bytes. For example, while the subsequence is consuming fewer input bytes, it is also generating fewer output bits, so that overall the compression ratio is improved (e.g. when comparing the bits used to encode some larger block of input spanning many subsequences against the net output bits which would be smaller). The following are some illustrative examples using the scoring algorithm, where the constant value is 8

Score (4, 2049)=4*8−10=22 (using 10 extra bits for distance of 2029)

Score (3, 5)=3*8−1=23 (using 1 extra bits for distance of 5)

In some embodiments, the scoring algorithm may be used to determine an estimated amount of a reduction in the compression data when using each matching data sequence identified by the matching unit 205. In this regard, the compression module 300 may select a data sequence with a higher score as the "best" match when compressing the input data stream 201. In this regard, the larger the length of the match (e.g., in bytes) between a selected data sequence and the input bit sequence 204, the higher the score will be for the selected data sequence as opposed to a non-selected data sequence. By contrast, the farther back from a location of the input bit sequence 204 in the input data stream 201 that the match is in terms of distance, the lower the score gets for that data sequence by an amount determined by the extra bits that need to be encoded for that distance. If one match is far enough back in the input data steam 201, then the closer match may be chosen as the "best" match even if it were only one byte smaller.

The compression module 300 may then encode the selected "best" match from the input data stream 201 as the module 300 moves data to an output bit sequence 303. In some embodiments, the compression module 300 may encode the best match as it is found in the input data stream 201. In other embodiments, the compression module 300 may store a location of the "best" match at a given position in the input data stream 201, and then look for a "best" match at a next position in the stream. If a new "best" match is not better than the current match (e.g., longer in length), the current match is output to the output bit sequence 303. Otherwise, the current match is output as a literal and the position of the new "best" match is stored. This process is repeated until the end of the input data stream 201.

To encode the "best" match that is the data sequence with the greater score, the compression module 300 may append a reference symbol 302 representing that data sequence to the output bit sequence 303. For example, reference symbol 302 may represent the data sequence 212 from the input data stream 201. In some embodiments, the reference symbol 302 may include an identifier to a length-distance (L, BD) pair of symbols. The length-distance pair of symbols may represent a backward distance (BD) in characters go back from a location in the input data stream, to locate a match of a given length (L) of those characters from that location. When encoding of the input data stream 201 to the output bit sequence 303 is complete (which may be also a final output of the compression module 300), the accelerator unit 140 may send a signal to indicate that the compressed data of output bit sequence 303 is ready for output.

Figure 4:
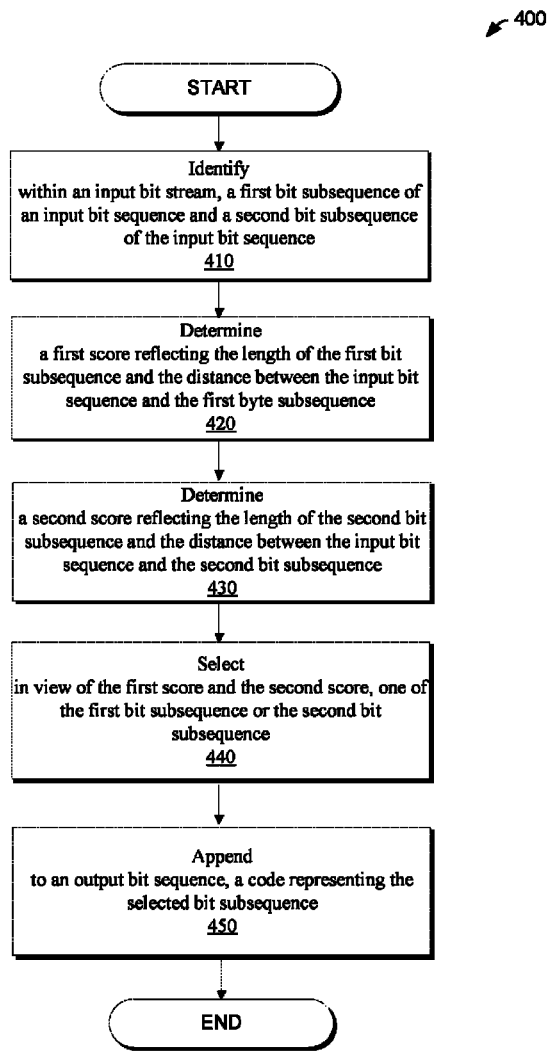
FIG. 4 illustrates a flow diagram of a method for supporting data compression using match scoring according to one embodiment.

FIG. 4 illustrates a flow diagram of a method 400 for supporting data compression using match scoring according to one embodiment. Method 400 may be performed by processing logic that may comprise hardware (e.g., circuitry, dedicated logic, programmable logic, microcode, etc.), software (such as instructions run on a processing device), firmware, or a combination thereof. In one embodiment, the accelerator unit 140 of processing device 100 in FIG. 1 may perform method 400. Although shown in a particular sequence or order, unless otherwise specified, the order of the processes can be modified. Thus, the illustrated implementations should be understood only as examples, and the illustrated processes can be performed in a different order, and some processes may be performed in parallel. Additionally, one or more processes can be omitted in various embodiments. Thus, not all processes are required in every implementation. Other process flows are possible.

Method 400 begins at block 410 where a first bit subsequence of an input bit sequence and a second bit subsequence of the input bit sequence are identified within an input bit stream. In some embodiments, the input bit stream may represent a stream of data to be compressed. At block 420, a first score reflecting the length of the first bit subsequence and the distance between the input bit sequence and the first bit subsequence is determined. At block 430, a second score reflecting the length of the second bit subsequence and the distance between the input bit sequence and the second bit subsequence is determined. In view of the first score and the second score, one of the first bit subsequence or the second bit subsequence is selected at block 440. At block 450, a code representing the selected bit subsequence is appended to an output bit sequence.

Figure 5:
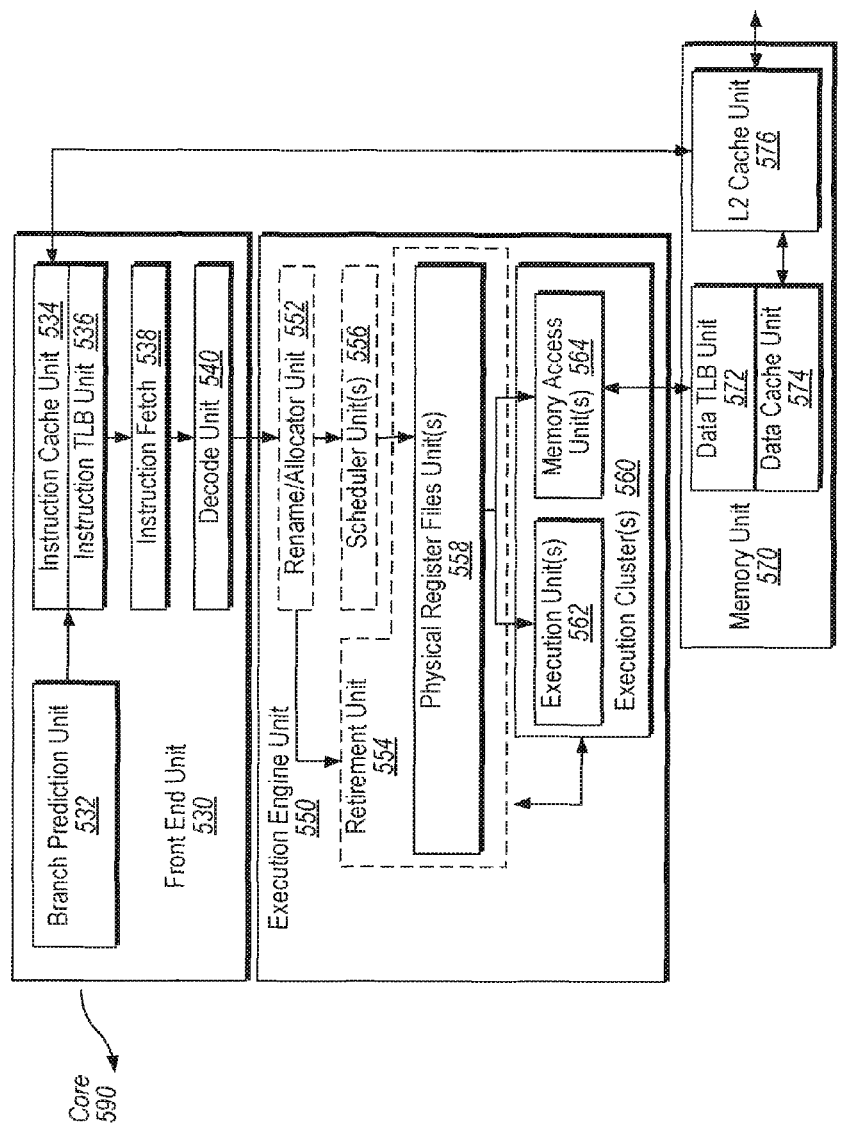
FIG. 5A is a block diagram illustrating a micro-architecture for a processor according to one embodiment.
FIG. 5B is a block diagram illustrating an in-order pipeline and a register renaming stage, out-of-order issue/execution pipeline according to one embodiment.

FIG. 5A is a block diagram illustrating a micro-architecture for a processor 500 that implements techniques for supporting data compression using match scoring functionality in accordance with one embodiment of the disclosure. Specifically, processor 500 depicts an in-order architecture core and a register renaming logic, out-of-order issue/execution logic to be included in a processor according to at least one embodiment of the disclosure.

Processor 500 includes a front-end unit 530 coupled to an execution engine unit 550, and both are coupled to a memory unit 570. The processor 500 may include a reduced instruction set computing (RISC) core, a complex instruction set computing (CISC) core, a very long instruction word (VLIW) core, or a hybrid or alternative core type. As yet another option, processor 500 may include a special-purpose core, such as, for example, a network or communication core, compression engine, graphics core, or the like. In one embodiment, processor 500 may be a multi-core processor or may part of a multi-processor system.

The front end unit 530 includes a branch prediction unit 532 coupled to an instruction cache unit 534, which is coupled to an instruction translation lookaside buffer (TLB) 536, which is coupled to an instruction fetch unit 538, which is coupled to a decode unit 540. The decode unit 540 (also known as a decoder) may decode instructions, and generate as an output one or more micro-operations, micro-code entry points, microinstructions, other instructions, or other control signals, which are decoded from, or which otherwise reflect, or are derived from, the original instructions. The decoder 540 may be implemented using various different mechanisms. Examples of suitable mechanisms include, but are not limited to, look-up tables, hardware implementations, programmable logic arrays (PLAs), microcode read only memories (ROMs), etc. The instruction cache unit 534 is further coupled to the memory unit 570. The decode unit 540 is coupled to a rename/allocator unit 552 in the execution engine unit 550.

The execution engine unit 550 includes the rename/allocator unit 552 coupled to a retirement unit 554 and a set of one or more scheduler unit(s) 556. The scheduler unit(s) 556 represents any number of different schedulers, including reservations stations (RS), central instruction window, etc. The scheduler unit(s) 556 is coupled to the physical register file(s) unit(s) 558. Each of the physical register file(s) units 558 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 558 is overlapped by the retirement unit 554 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.). The execution engine unit 550 may include for example a power management unit (PMU) 590 that governs power functions of the functional units.

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 554 and the physical register file(s) unit(s) 558 are coupled to the execution cluster(s) 560. The execution cluster(s) 560 includes a set of one or more execution units 562 and a set of one or more memory access units 564. The execution units 562 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 556, physical register file(s) unit(s) 558, and execution cluster(s) 560 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 564). It should also be understood that where separate pipelines are used, one or more of these pipelines may be out-of-order issue/execution and the rest in-order.

The set of memory access units 564 is coupled to the memory unit 570, which may include a data prefetcher 580, a data TLB unit 572, a data cache unit (DCU) 574, and a level 2 (L2) cache unit 576, to name a few examples. In some embodiments DCU 574 is also known as a first level data cache (L1 cache). The DCU 574 may handle multiple outstanding cache misses and continue to service incoming stores and loads. It also supports maintaining cache coherency. The data TLB unit 572 is a cache used to improve virtual address translation speed by mapping virtual and physical address spaces. In one exemplary embodiment, the memory access units 564 may include a load unit, a store address unit, and a store data unit, each of which is coupled to the data TLB unit 572 in the memory unit 570. The L2 cache unit 576 may be coupled to one or more other levels of cache and eventually to a main memory.

In one embodiment, the data prefetcher 580 speculatively loads/prefetches data to the DCU 574 by automatically predicting which data a program is about to consume. Prefeteching may refer to transferring data stored in one memory location of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

In one implementation, processor 500 may be the same as processing device 100 described with respect to FIG. 1. In particular, the data TLB unit 572 may be the same as TLB 155 and described with respect to FIG. 1, to implement techniques for supporting data compression using match scoring in a processing device described with respect to implementations of the disclosure.

The processor 500 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIG. 5B is a block diagram illustrating an in-order pipeline and a register renaming stage, out-of-order issue/execution pipeline implemented by processor 500 of FIG. 5A according to some embodiments of the disclosure. The solid lined boxes in FIG. 5B illustrate an in-order pipeline, while the dashed lined boxes illustrates a register renaming, out-of-order issue/execution pipeline. In FIG. 5B, a processor pipeline 501 includes a fetch stage 502, a length decode stage 504, a decode stage 506, an allocation stage 508, a renaming stage 510, a scheduling (also known as a dispatch or issue) stage 512, a register read/memory read stage 514, an execute stage 516, a write back/memory write stage 518, an exception handling stage 522, and a commit stage 524. In some embodiments, the ordering of stages 502-524 may be different than illustrated and are not limited to the specific ordering shown in FIG. 5B.

Figure 6:
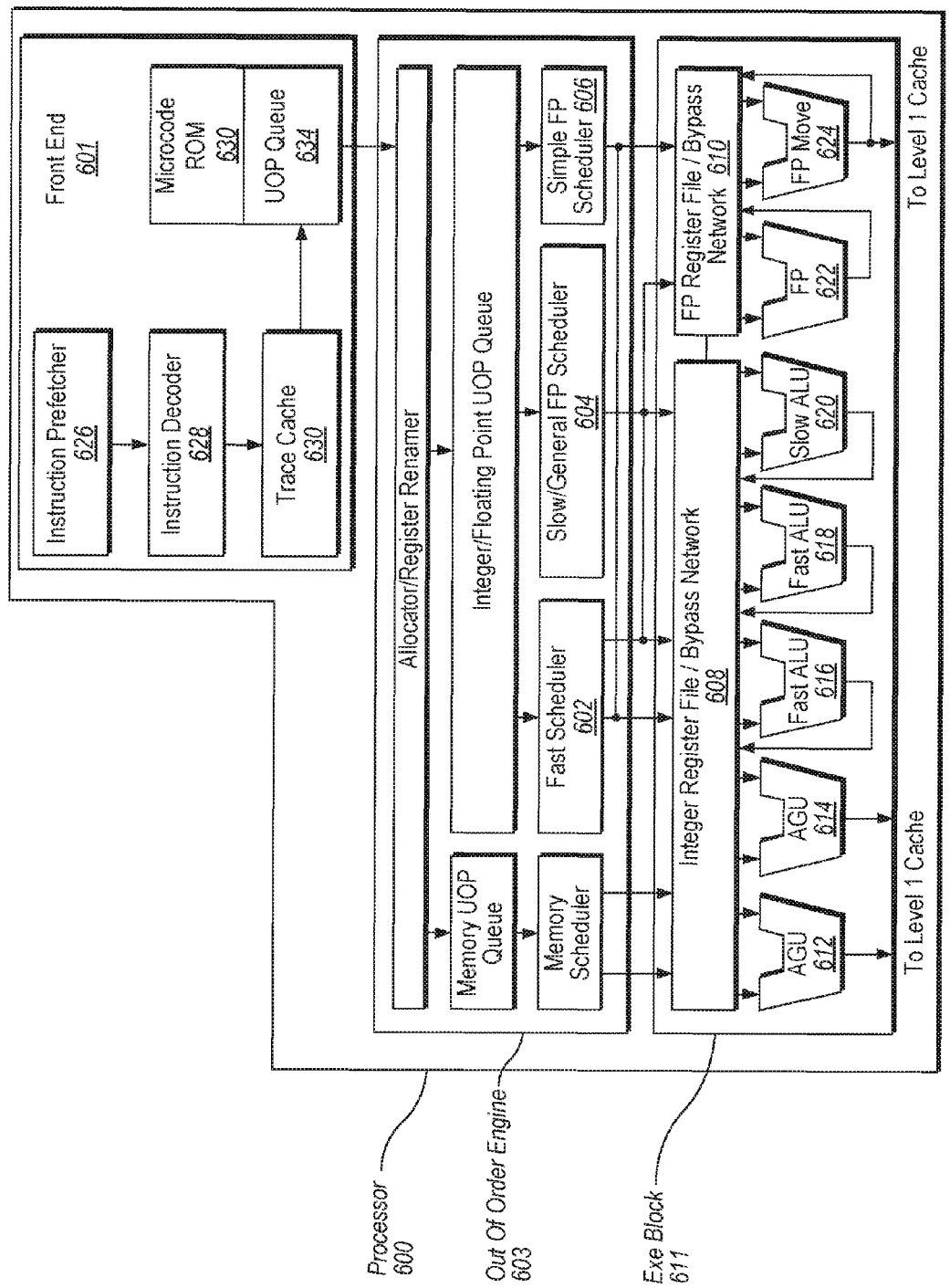
FIG. 6 is a block diagram illustrating a computer system according to one implementation.

FIG. 6 illustrates a block diagram of the micro-architecture for a processor 600 that includes logic circuits to implement techniques for supporting data compression using match-scoring functionality in accordance with one embodiment of the disclosure. In some embodiments, an instruction in accordance with one embodiment can be implemented to operate on data elements having sizes of byte, word, double word, quad word, etc., as well as datatypes, such as single and double precision integer and floating point datatypes. In one embodiment the in-order front end 601 is the part of the processor 600 that fetches instructions to be executed and prepares them to be used later in the processor pipeline.

The front end 601 may include several units. In one embodiment, the instruction prefetcher 626 fetches instructions from memory and feeds them to an instruction decoder 628, which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 630 takes decoded uops and assembles them into program ordered sequences or traces in the uop queue 634 for execution. When the trace cache 630 encounters a complex instruction, the microcode ROM 632 provides the uops needed to complete the operation.

Some instructions are converted into a single micro-op, whereas others need several micro-ops to complete the full operation. In one embodiment, if more than four micro-ops are needed to complete an instruction, the decoder 628 accesses the microcode ROM 632 to do the instruction. For one embodiment, an instruction can be decoded into a small number of micro ops for processing at the instruction decoder 628. In another embodiment, an instruction can be stored within the microcode ROM 632 should a number of micro-ops be needed to accomplish the operation. The trace cache 630 refers to an entry point programmable logic array (PLA) to determine a correct microinstruction pointer for reading the micro-code sequences to complete one or more instructions in accordance with one embodiment from the micro-code ROM 632. After the microcode ROM 632 finishes sequencing micro-ops for an instruction, the front end 601 of the machine resumes fetching micro-ops from the trace cache 630.

The out-of-order execution engine 603 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 602, slow/general floating point scheduler 604, and simple floating point scheduler 606. The uop schedulers 602, 604, 606, determine when a uop is ready to execute based on the readiness of their dependent input register operand sources and the availability of the execution resources the uops need to complete their operation. The fast scheduler 602 of one embodiment can schedule on each half of the main clock cycle while the other schedulers can only schedule once per main processor clock cycle. The schedulers arbitrate for the dispatch ports to schedule uops for execution.

Register files 608, 610 sit between the schedulers 602, 604, 606, and the execution units 612, 614, 616, 618, 620, 622, 624 in the execution block 611. There is a separate register file 608, 610, for integer and floating-point operations, respectively. Each register file 608, 610, of one embodiment also includes a bypass network that can bypass or forward just completed results that have not yet been written into the register file to new dependent uops. The integer register file 608 and the floating-point register file 610 are also capable of communicating data with the other. For one embodiment, the integer register file 608 is split into two separate register files, one register file for the low order 32 bits of data and a second register file for the high order 32 bits of data. The floating-point register file 610 of one embodiment has 128 bit wide entries because floating-point instructions typically have operands from 64 to 128 bits in width.

The execution block 611 contains the execution units 612, 614, 616, 618, 620, 622, 624, where the instructions are actually executed. This section includes the register files 608, 610, that store the integer and floating point data operand values that the microinstructions need to execute. The processor 600 of one embodiment is comprised of a number of execution units: address generation unit (AGU) 612, AGU 614, fast ALU 616, fast ALU 618, slow ALU 620, floating point ALU 622, floating point move unit 624. For one embodiment, the floating-point execution blocks 622, 624, execute floating point, MMX, SIMD, and SSE, or other operations. The floating point ALU 622 of one embodiment includes a 64 bit by 64 bit floating point divider to execute divide, square root, and remainder micro-ops. For embodiments of the disclosure, instructions involving a floating-point value may be handled with the floating-point hardware.

In one embodiment, the ALU operations go to the high-speed ALU execution units 616, 618. The fast ALUs 616, 618, of one embodiment can execute fast operations with an effective latency of half a clock cycle. For one embodiment, most complex integer operations go to the slow ALU 620 as the slow ALU 620 includes integer execution hardware for long latency type of operations, such as a multiplier, shifts, flag logic, and branch processing. The AGUs 612, 614, executes memory load/store operations. For one embodiment, the integer ALUs 616, 618, 620, are described in the context of performing integer operations on 64 bit data operands. In alternative embodiments, the ALUs 616, 618, 620, can be implemented to support a variety of data bits including 16, 32, 128, 256, etc. Similarly, the floating-point units 622, 624, can be implemented to support a range of operands having bits of various widths. For one embodiment, the floating-point units 622, 624, can operate on 128 bits wide packed data operands in conjunction with SIMD and multimedia instructions.

In one embodiment, the uops schedulers 602, 604, 606, dispatch dependent operations before the parent load has finished executing. As uops are speculatively scheduled and executed in processor 600, the processor 600 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 600 also includes logic to implement store address prediction for memory disambiguation according to embodiments of the disclosure. In one embodiment, the execution block 611 of processor 600 may include a store address predictor (not shown) for implementing techniques for supporting data compression using match scoring functionality.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also may contain an eight multimedia SIMD register for packed data.

For the discussions below, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 7:
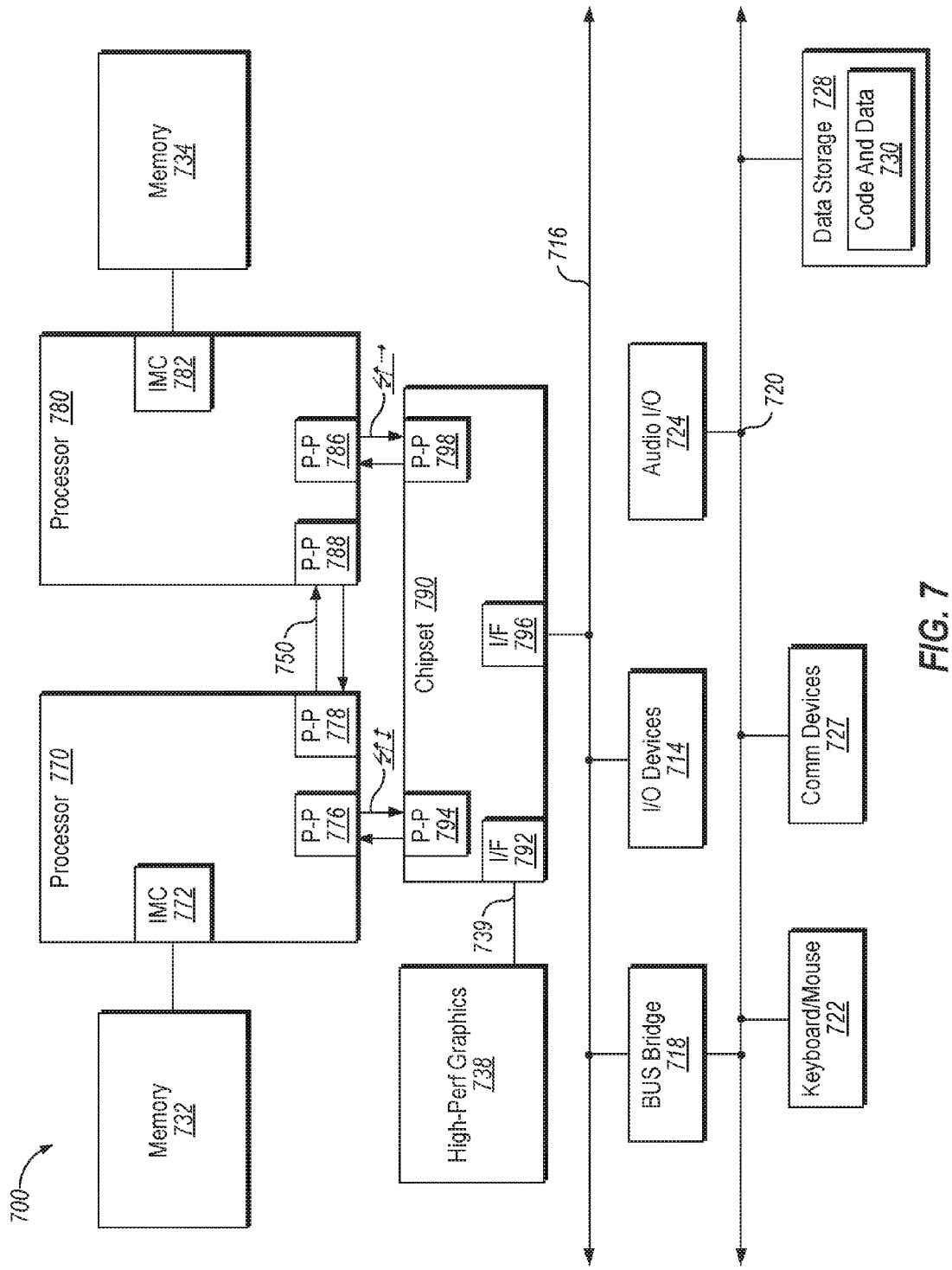
FIG. 7 is a block diagram illustrating a system in which an embodiment of the disclosure may be used.

Embodiments may be implemented in many different system types. Referring now to FIG. 7, shown is a block diagram illustrating a system 700 in which an embodiment of the disclosure may be used. As shown in FIG. 7, multi-processor system 700 is a point-to-point interconnect system, and includes a first processor 770 and a second processor 780 coupled via a point-to-point interconnect 750. While shown with only two processors 770, 780, it is to be understood that the scope of embodiments of the disclosure is not so limited. In other embodiments, one or more additional processors may be present in a given processor. In one embodiment, the multiprocessor system 700 may implement techniques for supporting data compression using match scoring functionality as described herein.

Processors 770 and 780 are shown including integrated memory controller units 772 and 782, respectively. Processor 770 also includes as part of its bus controller units point-to-point (P-P) interfaces 776 and 778; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may exchange information with a chipset 790 via individual P-P interfaces 752, 754 using point to point interface circuits 776, 794, 786, 798. Chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the disclosure is not so limited.

As shown in FIG. 7, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures are possible. For example, instead of the point-to-point architecture of FIG. 7, a system may implement a multi-drop bus or other such architecture.

Figure 8:
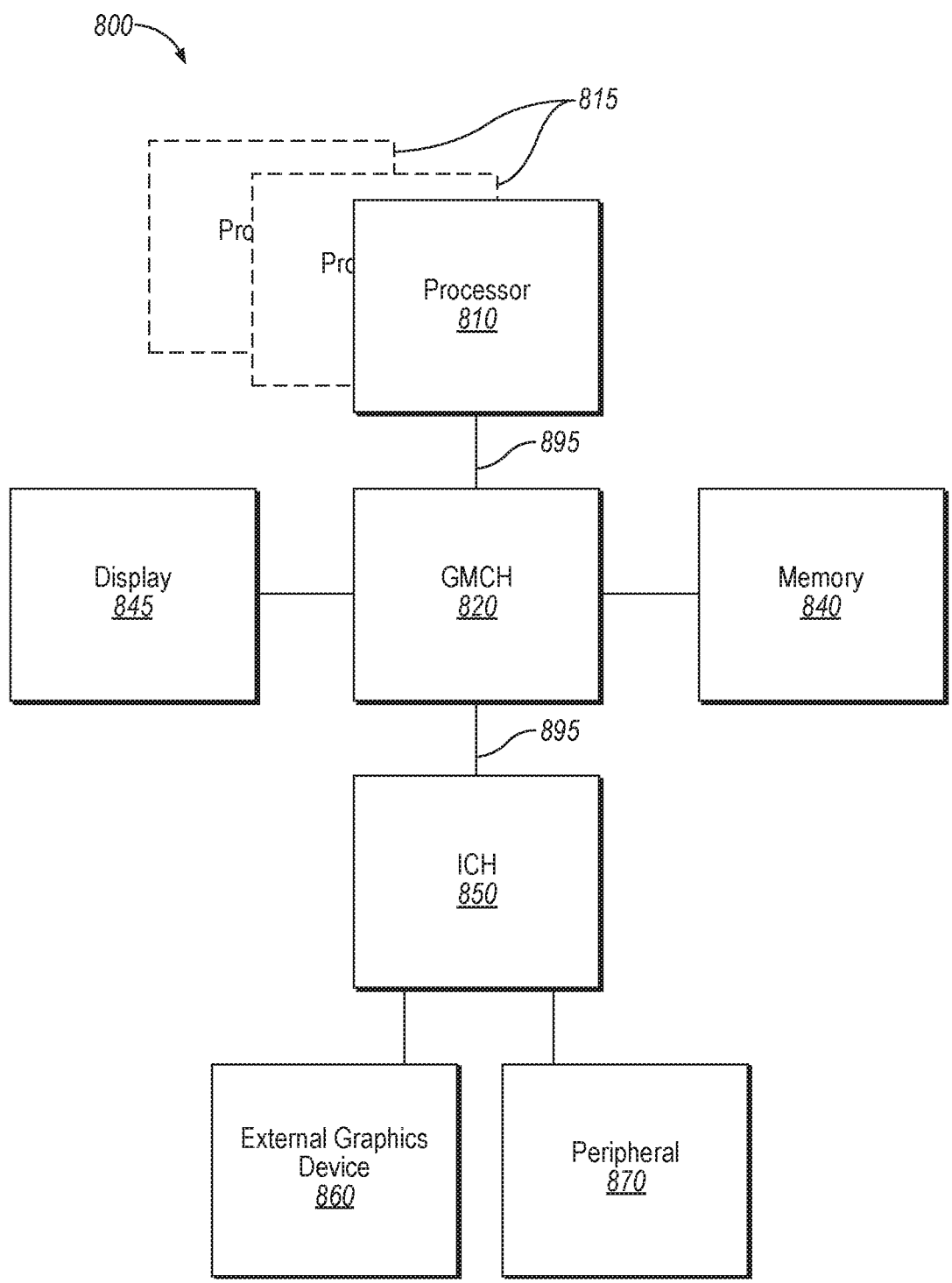
FIG. 8 is a block diagram illustrating a system in which an embodiment of the disclosure may be used.

Referring now to FIG. 8, shown is a block diagram of a system 800 in which one embodiment of the disclosure may operate. The system 800 may include one or more processors 810, 815, which are coupled to graphics memory controller hub (GMCH) 820. The optional nature of additional processors 815 is denoted in FIG. 8 with broken lines. In one embodiment, processors 810, 815 implement techniques for supporting data compression using match scoring functionality according to embodiments of the disclosure.

Each processor 810, 815 may be some version of the circuit, integrated circuit, processor, and/or silicon integrated circuit as described above. However, it should be noted that it is unlikely that integrated graphics logic and integrated memory control units would exist in the processors 810, 815. FIG. 8 illustrates that the GMCH 820 may be coupled to a memory 840 that may be, for example, a dynamic random access memory (DRAM). The DRAM may, for at least one embodiment, be associated with a non-volatile cache.

The GMCH 820 may be a chipset, or a portion of a chipset. The GMCH 820 may communicate with the processor(s) 810, 815 and control interaction between the processor(s) 810, 815 and memory 840. The GMCH 820 may also act as an accelerated bus interface between the processor(s) 810, 815 and other elements of the system 800. For at least one embodiment, the GMCH 820 communicates with the processor(s) 810, 815 via a multi-drop bus, such as a frontside bus (FSB) 895.

Furthermore, GMCH 820 is coupled to a display 845 (such as a flat panel or touchscreen display). GMCH 820 may include an integrated graphics accelerator. GMCH 820 is further coupled to an input/output (I/O) controller hub (ICH) 850, which may be used to couple various peripheral devices to system 800. Shown for example in the embodiment of FIG. 8 is an external graphics device 860, which may be a discrete graphics device, coupled to ICH 850, along with another peripheral device 870.

Alternatively, additional or different processors may also be present in the system 800. For example, additional processor(s) 815 may include additional processors(s) that are the same as processor 810, additional processor(s) that are heterogeneous or asymmetric to processor 810, accelerators (such as, e.g., graphics accelerators or digital signal processing (DSP) units), field programmable gate arrays, or any other processor. There can be a variety of differences between the processor(s) 810, 815 in terms of a spectrum of metrics of merit including architectural, micro-architectural, thermal, power consumption characteristics, and the like. These differences may effectively manifest themselves as asymmetry and heterogeneity amongst the processors 810, 815. For at least one embodiment, the various processors 810, 815 may reside in the same die package.

Figure 9:
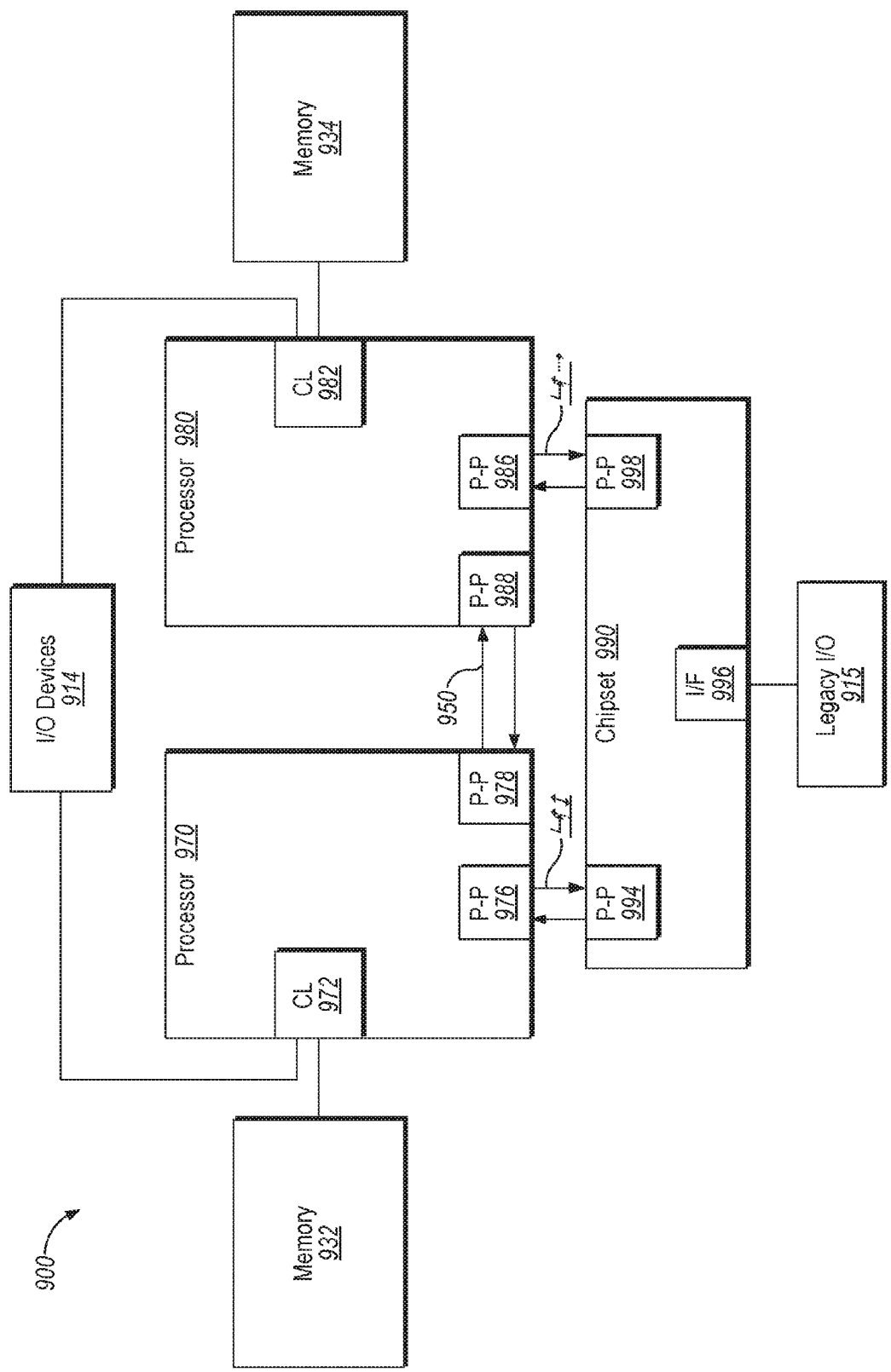
FIG. 9 is a block diagram illustrating a system in which an embodiment of the disclosure may be used.

Referring now to FIG. 9, shown is a block diagram of a system 900 in which an embodiment of the disclosure may operate. FIG. 9 illustrates processors 970, 980. In one embodiment, processors 970, 980 may techniques for supporting data compression using match scoring functionality as described above. Processors 970, 980 may include integrated memory and I/O control logic ("CL") 972 and 982, respectively and intercommunicate with each other via point-to-point interconnect 950 between point-to-point (P-P) interfaces 978 and 988 respectively. Processors 970, 980 each communicate with chipset 990 via point-to-point interconnects 952 and 954 through the respective P-P interfaces 976 to 994 and 986 to 998 as shown. For at least one embodiment, the CL 972, 982 may include integrated memory controller units. CLs 972, 982 may include I/O control logic. As depicted, memories 932, 934 coupled to CLs 972, 982 and I/O devices 914 are also coupled to the control logic 972, 982. Legacy I/O devices 915 are coupled to the chipset 990 via interface 996.

Figure 10:
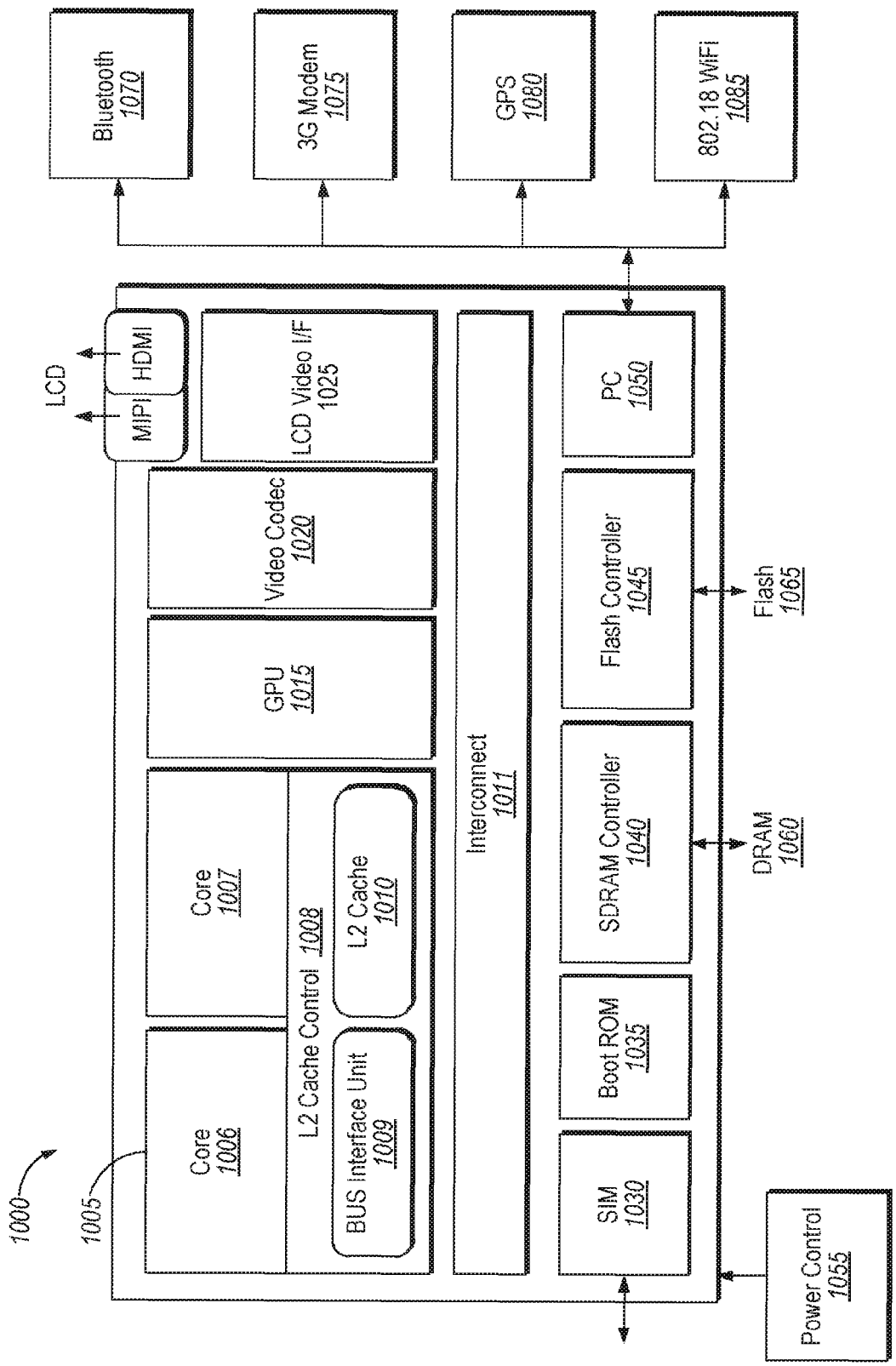
FIG. 10 is a block diagram illustrating a System-on-a-Chip (SoC) in which an embodiment of the disclosure may be used.

Embodiments may be implemented in many different system types. FIG. 10 is a block diagram of a SoC 1000 in accordance with an embodiment of the disclosure. Dashed lined boxes are optional features on more advanced SoCs. In FIG. 10, an interconnect unit(s) 1012 is coupled to: an application processor 1020 which includes a set of one or more cores 1002A-N and shared cache unit(s) 1006; a system agent unit 1010; a bus controller unit(s) 1016; an integrated memory controller unit(s) 1014; a set or one or more media processors 1018 which may include integrated graphics logic 1008, an image processor 1024 for providing still and/or video camera functionality, an audio processor 1026 for providing hardware audio acceleration, and a video processor 1028 for providing video encode/decode acceleration; an static random access memory (SRAM) unit 1030; a direct memory access (DMA) unit 1032; and a display unit 1040 for coupling to one or more external displays. In one embodiment, a memory module may be included in the integrated memory controller unit(s) 1014. In another embodiment, the memory module may be included in one or more other components of the SoC 1000 that may be used to access and/or control a memory. The application processor 1020 may include a PMU for implementing silent memory instructions and miss-rate tracking to optimize switching policy on threads as described in embodiments herein.

The memory hierarchy includes one or more levels of cache within the cores, a set or one or more shared cache units 1006, and external memory (not shown) coupled to the set of integrated memory controller units 1014. The set of shared cache units 1006 may include one or more mid-level caches, such as level 2 (L2), level 3 (L3), level 4 (L4), or other levels of cache, a last level cache (LLC), and/or combinations thereof.

In some embodiments, one or more of the cores 1002A-N are capable of multithreading. The system agent 1010 includes those components coordinating and operating cores 1002A-N. The system agent unit 1010 may include for example a power control unit (PCU) and a display unit. The PCU may be or include logic and components needed for regulating the power state of the cores 1002A-N and the integrated graphics logic 1008. The display unit is for driving one or more externally connected displays.

The cores 1002A-N may be homogenous or heterogeneous in terms of architecture and/or instruction set. For example, some of the cores 1002A-N may be in order while others are out-of-order. As another example, two or more of the cores 1002A-N may be capable of execution the same instruction set, while others may be capable of executing only a subset of that instruction set or a different instruction set.

The application processor 1020 may be a general-purpose processor, such as a Core™ i3, i5, i7, 2 Duo and Quad, Xeon™, Itanium™, Atom™ or Quark™ processor, which are available from Intel™ Corporation, of Santa Clara, Calif. Alternatively, the application processor 1020 may be from another company, such as ARM Holdings™, Ltd, MIPS™, etc. The application processor 1020 may be a special-purpose processor, such as, for example, a network or communication processor, compression engine, graphics processor, co-processor, embedded processor, or the like. The application processor 1020 may be implemented on one or more chips. The application processor 1020 may be a part of and/or may be implemented on one or more substrates using any of a number of process technologies, such as, for example, BiCMOS, CMOS, or NMOS.

Figure 11:
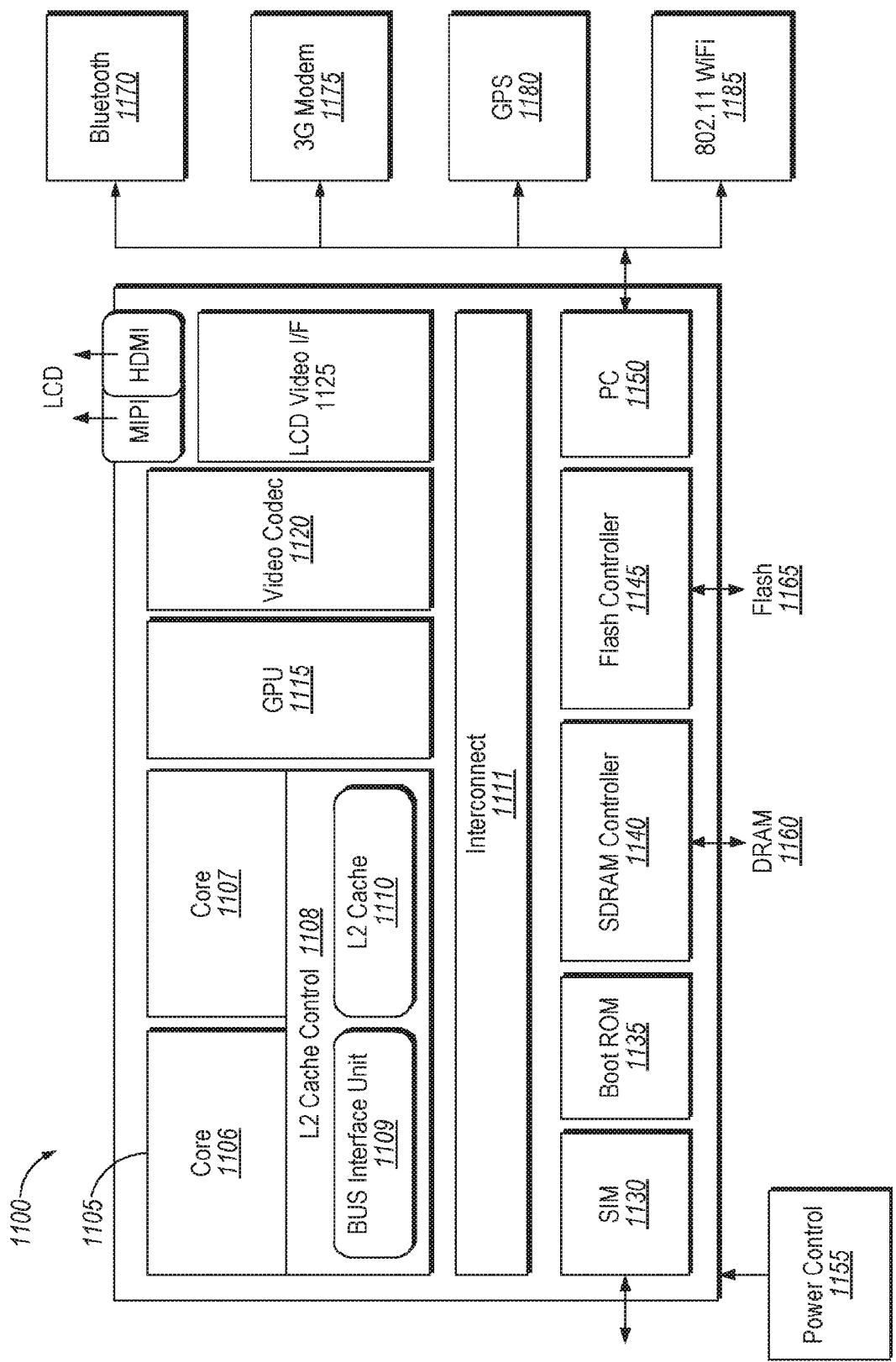
FIG. 11 is a block diagram illustrating a SoC design in which an embodiment of the disclosure may be used.

FIG. 11 is a block diagram of an embodiment of a system on-chip (SoC) design in accordance with the disclosure. As a specific illustrative example, SoC 1100 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1100 includes 2 cores—1106 and 1107. Cores 1106 and 1107 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1106 and 1107 are coupled to cache control 1108 that is associated with bus interface unit 1109 and L2 cache 1110 to communicate with other parts of system 1100. Interconnect 1110 includes an on-chip interconnect, such as an IOSF, AMBA, or other interconnect discussed above, which potentially implements one or more aspects of the described disclosure. In one embodiment, cores 1106, 1107 may implement techniques for supporting data compression using match scoring functionality as described in embodiments herein.

Interconnect 1110 provides communication channels to the other components, such as a Subscriber Identity Module (SIM) 1130 to interface with a SIM card, a boot ROM 1140 to hold boot code for execution by cores 1106 and 1107 to initialize and boot SoC 1100, a SDRAM controller 1140 to interface with external memory (e.g. DRAM 1160), a flash controller 1145 to interface with non-volatile memory (e.g. Flash 1165), a peripheral control 1150 (e.g. Serial Peripheral Interface) to interface with peripherals, video codecs 1120 and Video interface 1125 to display and receive input (e.g. touch enabled input), GPU 1115 to perform graphics related computations, etc. Any of these interfaces may incorporate aspects of the disclosure described herein. In addition, the system 1100 illustrates peripherals for communication, such as a Bluetooth module 1170, 3G modem 1175, GPS 1180, and Wi-Fi 1185.

Figure 12:
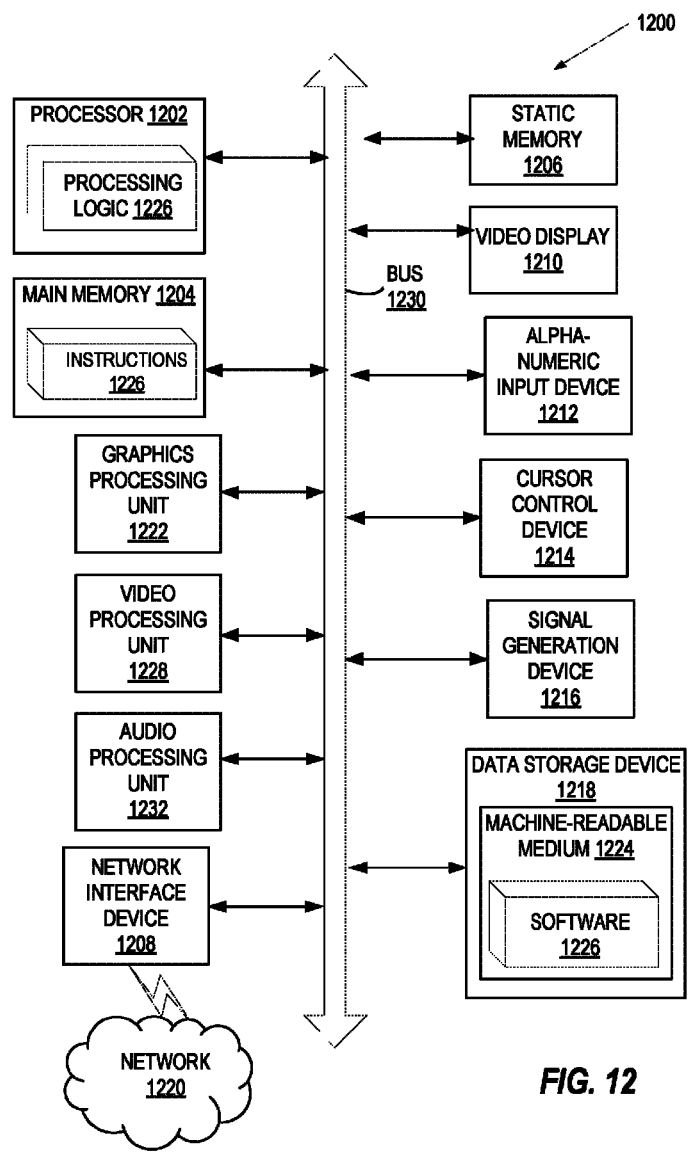
FIG. 12 illustrates a block diagram illustrating a computer system in which an embodiment of the disclosure may be used.

FIG. 12 illustrates a diagrammatic representation of a machine in the example form of a computer system 1200 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computer system 1200 includes a processing device 1202, a main memory 1204 (e.g., read-only memory (ROM), flash memory, dynamic random access memory (DRAM) (such as synchronous DRAM (SDRAM) or DRAM (RDRAM), etc.), a static memory 1206 (e.g., flash memory, static random access memory (SRAM), etc.), and a data storage device 1218, which communicate with each other via a bus 1230.

Processing device 1202 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. In one embodiment, processing device 1202 may include one or processing cores. The processing device 1202 is configured to execute the processing logic 1226 for performing the operations and steps discussed herein. In one embodiment, processing device 1202 is the same as processor architecture 100 described with respect to FIG. 1 that implements techniques for supporting data compression using match scoring functionality as described herein with embodiments of the disclosure.

The computer system 1200 may further include a network interface device 1208 communicably coupled to a network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), and a signal generation device 1216 (e.g., a speaker). Furthermore, computer system 1200 may include a graphics processing unit 1222, a video processing unit 1228, and an audio processing unit 1232.

The data storage device 1218 may include a non-transitory machine-accessible storage medium 1224 on which is stored software 1226 implementing any one or more of the methodologies of functions described herein, such as implementing silent memory instructions and miss-rate tracking to optimize switching policy on threads in a processing device as described above. The software 1226 may also reside, completely or at least partially, within the main memory 1204 as instructions 1226 and/or within the processing device 1202 as processing logic 1226 during execution thereof by the computer system 1200; the main memory 1204 and the processing device 1202 also constituting machine-accessible storage media.

The non-transitory machine-readable storage medium 1224 may also be used to store instructions 1226 implementing silent memory instructions and miss-rate tracking to optimize switching policy on threads in a processing device such as described with respect to processing device 100 in FIG. 1, and/or a software library containing methods that call the above applications. While the non-transitory machine-accessible storage medium 1224 is shown in an example embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instruction for execution by the machine and that cause the machine to perform any one or more of the methodologies of the disclosure. The term "machine-accessible storage medium" shall accordingly be taken to include, but not be limited to, solid-state memories, and optical and magnetic media.

The following examples pertain to further embodiments.

Example 1 is a processing system comprising: 1) a memory for storing an input bit stream; and 2) a processing logic to: a) identify, within the input bit stream, a first bit subsequence of an input bit sequence and a second bit subsequence of the input bit sequence; b) determine a first score reflecting the length of the first bit subsequence and the distance, within the input bit stream, between the input bit sequence and the first bit subsequence; c) determine a second score reflecting the length of the second bit subsequence and the distance, within the input bit stream, between the input bit sequence and the second bit subsequence; d) select, in view of the first score and the second score, one of the first bit subsequence or the second bit subsequence; and e) append, to an output bit sequence, a code representing a selected bit subsequence.

In Example 2, the subject matter of Example 1, wherein the code reflects at least one of: a length of the selected bit subsequence or a distance between the input bit sequence and the selected bit subsequence.

In Example 3, the subject matter of any one of Examples 1-2, wherein to select one of the first bit subsequence or the second bit subsequence, the processing logic further to compare the first score and the second score.

In Example 4, the subject matter of any one of Examples 1-3, wherein a score associated with the selected bit subsequence is greater than a score associated with a non-selected bit subsequence.

In Example 5, the subject matter of any one of Examples 1-4, wherein a length of the selected bit subsequence is shorter than a length of the non-selected bit subsequence.

In Example 6, the subject matter of any one of Examples 1-5, wherein the distance between the input bit sequence and the selected subsequence is shorter than a distance between the input bit sequence and the non-selected bit subsequence.

In Example 7, the subject matter of any one of Examples 1-6, wherein the score associated with the selected subsequence reflects a determination of an amount of bits used to generate the code.

Various embodiments may have different combinations of the structural features described above. For instance, all optional features of the processor described above may also be implemented with respect to a method or process described herein and specifics in the examples may be used anywhere in one or more embodiments.

Example 8 is a method comprising 1) identifying, within an input bit stream, a first bit subsequence of an input bit sequence and a second bit subsequence of the input bit sequence; 2) determining, using a processing device, a first score reflecting the length of the first bit subsequence and the distance between the input bit sequence and the first bit subsequence; 3) determining, using the processing device, a second score reflecting the length of the second bit subsequence, within the input bit stream, and the distance between the input bit sequence and the second bit subsequence; 4) selecting, in view of the first score and the second score, one of the first bit subsequence or the second bit subsequence; and 5) appending, to an output bit sequence, a code representing a selected bit subsequence.

In Example 9, the subject matter of Example 10, wherein selecting one of the first bit subsequence or the second bit subsequence, further comprises comparing the first score and the second score.

In Example 10, the subject matter of any one of Example 8-9, wherein selecting one of the first bit subsequence or the second bit subsequence, further comprises comparing the first score and the second score.

In Example 11, the subject matter of any one of Example 8-10, wherein a score associated with the selected bit subsequence is greater than a score associated with a non-selected bit subsequence.

In Example 12, the subject matter of any one of Example 8-11, wherein a length of the selected bit subsequence is shorter than a length of the non-selected bit subsequence.

In Example 13, the subject matter of any one of Example 8-12, wherein the distance between the input bit sequence and the selected subsequence is shorter than a distance between the input bit sequence and the non-selected bit subsequence.

In Example 14, the subject matter of any one of Example 8-13, wherein the score associated with the selected subsequence reflects a determination of an amount of bits used to generate the code.

Various embodiments may have different combinations of the structural features described above. For instance, all optional features of the processors and methods described above may also be implemented with respect to a system described herein and specifics in the examples may be used anywhere in one or more embodiments.

Example 15 is a system on chip (SoC) comprising: 1) a memory controller unit (MCU); and 2) a processor, operatively coupled to the MCU, to: a) identify, within an input bit stream, a first bit subsequence of an input bit sequence and a second bit subsequence of the input bit sequence; b) determine a first score reflecting the length of the first bit subsequence and the distance between the input bit sequence and the first bit subsequence; c) determine a second score reflecting the length of the second bit subsequence, within the input bit stream, and the distance between the input bit sequence and the second bit subsequence; d) select, in view of the first score and the second score, one of the first bit subsequence or the second bit subsequence; and e) append, to an output bit sequence, a code representing a selected bit subsequence.

In Example 16, the subject matter of any one of Examples 15, wherein the code reflects at least one of: a length of the selected bit subsequence or a distance between the input bit sequence and the selected bit subsequence.

In Example 17, the subject matter of any one of Examples 15-16, wherein to select one of the first bit subsequence or the second bit subsequence, the processor further to compare the first score and the second score.

In Example 18, the subject matter of any one of Examples 15-17, wherein a score associated with the selected bit subsequence is greater than a score associated with a non-selected bit subsequence.

In Example 19, the subject matter of any one of Examples 15-18, wherein a length of the selected bit subsequence is shorter than a length of the non-selected bit subsequence.

In Example 20, the subject matter of any one of Examples 15-19, wherein the distance between the input bit sequence and the selected subsequence is shorter than a distance between the input bit sequence and the non-selected bit subsequence.

In Example 21, the subject matter of any one of Examples 15-20, wherein the score associated with the selected subsequence reflects a determination of an amount of bits used to generate the code.

Various embodiments may have different combinations of the operational features described above. For instance, all optional features of the methods described above may also be implemented with respect to a non-transitory, computer-readable storage medium. Specifics in the examples may be used anywhere in one or more embodiments.

Example 22 is a non-transitory, computer-readable storage medium including instructions that when executed by a processor, cause the processor to: 1) identify, within the input bit stream, a first bit subsequence of an input bit sequence and a second bit subsequence of the input bit sequence; 2) determine, using the processing device, a first score reflecting the length of the first bit subsequence and the distance, within the input bit stream, between the input bit sequence and the first bit subsequence; 3) determine, using the processing device, a second score reflecting the length of the second bit subsequence and the distance, within the input bit stream, between the input bit sequence and the second bit subsequence; 4) select, in view of the first score and the second score, one of the first bit subsequence or the second bit subsequence; and 5) append, to an output bit sequence, a code representing a selected bit subsequence.

In Example 23, the subject matter of any one of Examples 22, wherein the code reflects at least one of: a length of the selected bit subsequence or a distance between the input bit sequence and the selected bit subsequence.

In Example 24, the subject matter of any one of Examples 22-23, wherein to select one of the first bit subsequence or the second bit subsequence, the executable instructions further cause the processing device to compare the first score and the second score.

In Example 25, the subject matter of any one of Examples 22-24, wherein a score associated with the selected bit subsequence is greater than a score associated with a non-selected bit subsequence.

In Example 26, the subject matter of any one of Examples 22-25, wherein a length of the selected bit subsequence is shorter than a length of the non-selected bit subsequence.

In Example 27, the subject matter of any one of Examples 22-26, wherein the distance between the input bit sequence and the selected subsequence is shorter than a distance between the input bit sequence and the non-selected bit subsequence.

In Example 28, the subject matter of any one of Examples 22-27, wherein the score associated with the selected subsequence reflects a determination of an amount of bits used to generate the code.

Example 29 is a non-transitory, computer-readable storage medium including instructions that, when executed by a processor, cause the processor to perform the method of examples 8-14.

Example 30 is an apparatus comprising: 1) a plurality of functional units of a processor; 2) means for identifying, within an input bit stream, a first bit subsequence of an input bit sequence and a second bit subsequence of the input bit sequence; 3) means for searching, by the processor, for locations of a data bit sequence repeated in the data block; 4) means for determining, using the processor, a first score reflecting the length of the first bit subsequence and the distance between the input bit sequence and the first bit subsequence; 5) means for determining, using the processor, a second score reflecting the length of the second bit subsequence, within the input bit stream, and the distance between the input bit sequence and the second bit subsequence; 6) means selecting, in view of the first score and the second score, one of the first bit subsequence or the second bit subsequence; and 7) means for appending, to an output bit sequence, a code representing a selected bit subsequence.

In Example 31, the subject matter of claim 30, further comprising the subject matter of any of examples 1-7 and 15-21.

Example 32 is a system comprising: 1) a memory device and 2) a processor comprising a memory controller unit, wherein the processor is configured to perform the method of any of examples 8-14.

In Example 33, the subject matter of claim 32, further comprising the subject matter of any of examples 1-7 and 15-21.

While the disclosure has been described respect to a limited number of embodiments, those skilled in the art will appreciate numerous modifications and variations there from. It is intended that the appended claims cover all such modifications and variations as fall within the true spirit and scope of this disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 910 and a hexadecimal letter A. Therefore, a value includes any representation of information capable of being held in a computer system.

Moreover, values or portions of values may represent states. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A processing system comprising:
a memory for storing an input bit stream; and
a processing device, operatively coupled to the memory, to:
identify a candidate bit subsequence within the input bit stream;
identify a first bit subsequence and a second bit subsequence based on the candidate bit subsequence;
determine a first score for the first bit subsequence based on a location of first bit subsequence in the input bit stream with respect to the candidate bit subsequence;

determine a second score for the second bit subsequence based on a location of second bit subsequence in the input bit stream with respect to the candidate bit subsequence; and replace data associated with one of the first bit subsequence or the second bit subsequence in an output bit stream based on the first score and the second score.

2. The processing system of claim 1, wherein the processing device is to determine a selected bit subsequence for the replace data associated with a greater corresponding score of the first score and second score.

3. The processing system of claim 2, wherein the processing device further to generate a binary code based on the selected bit subsequence.

4. The processing system of claim 3, wherein a corresponding score associated with the replace data reflects a determination of an amount of bits used to generate the binary code.

5. The processing system of claim 1, wherein the processing device further to identify the candidate bit subsequence in the bit stream based on a hash function.

6. The processing system of claim 1, wherein to produce the first score or second score, the processing device is further to identify a most significant bit in a corresponding one of the first bit subsequence or the second bit subsequence.

7. The processing system of claim 1, wherein the replaced data in the output bit stream indicates a compression of data associated with the first bit subsequence or the second bit subsequence.

8. A method comprising:
identifying a candidate bit subsequence within the input bit stream;
identifying a first bit subsequence and a second bit subsequence based on the candidate bit subsequence;
determining, by a processing device, a first score for the first bit subsequence based on a location of first bit subsequence in the input bit stream with respect to the candidate bit subsequence;
determining, by the processing device, a second score for the second bit subsequence based on a location of second bit subsequence in the input bit stream with respect to the candidate bit subsequence; and
replacing, by the processing device, data associated with one of the first bit subsequence or the second bit subsequence in an output bit stream based on the first score and the second score.

9. The method of claim 8, further comprising determining a selected bit subsequence for the replace data associated with a greater corresponding score of the first score and second score.

10. The method of claim 9, further comprising generating a binary code based on the selected bit subsequence.

11. The method of claim 10, wherein a corresponding score associated with the replaced data reflects a determination of an amount of bits used to generate the binary code.

12. The method of claim 8, further comprising identifying the candidate bit subsequence in the bit stream based on a hash function.

13. The method of claim 8, wherein to produce the first score or second score, further comprises identifying a most significant bit in a corresponding one of the first bit subsequence or the second bit subsequence.

14. The method of claim 8, wherein the replaced data in the output bit stream indicates a compression of data associated with the first bit subsequence or the second bit subsequence.

15. A non-transitory computer readable storage medium storing executable instructions, that when executed by a processing device, cause the processing device to:
identify, by the processing device, a candidate bit subsequence within the input bit stream;
identify a first bit subsequence and a second bit subsequence based on the candidate bit subsequence;
determine a first score for the first bit subsequence based on a location of first bit subsequence in the input bit stream with respect to the candidate bit subsequence;
determine a second score for the second bit subsequence based on a location of second bit subsequence in the input bit stream with respect to the candidate bit subsequence; and
replace data associated with one of the first bit subsequence or the second bit subsequence in an output bit stream based on the first score and the second score.

16. The non-transitory computer readable storage medium of claim 15, wherein the processing device is to determine a selected bit subsequence for the replace data associated with a greater corresponding score of the first score and second score.

17. The non-transitory computer readable storage medium of claim 16, wherein the processing device is further to generate a binary code based on the selected bit subsequence.

18. The non-transitory computer readable storage medium of claim 17, wherein a corresponding score associated with the selected bit subsequence reflects a determination of an amount of bits used to generate the binary code.

19. The non-transitory computer readable storage medium of claim 15, wherein the processing device is further to identify the candidate bit subsequence in the bit stream based on a hash function.

20. The non-transitory computer readable storage medium of claim 15, wherein to produce the first score or second score, the processing device further to identify a most significant bit in a corresponding one of the first bit subsequence or the second bit subsequence.

* * * * *